United States Patent [19]

Sigmon et al.

[11] Patent Number: 4,843,347

[45] Date of Patent: Jun. 27, 1989

[54] PASSIVE STABILIZER FOR A SIGNAL GENERATING SOURCE

[75] Inventors: Bernard E. Sigmon, Tempe; Lawrence J. Schmacher, Chandler, both of Ariz.

[73] Assignee: Motorola, Inc., Schaumburg, Ill.

[21] Appl. No.: 199,547

[22] Filed: May 27, 1988

[51] Int. Cl.$^4$ ............................................. H03B 9/10
[52] U.S. Cl. .................................... 331/88; 315/39.53
[58] Field of Search ..................... 331/74, 86, 88, 96; 315/39.51, 39.53; 333/1.1, 24.1, 230, 234

[56] References Cited

U.S. PATENT DOCUMENTS 2,708,222  5/1955  Herlin .................................. 331/88
3,866,144  2/1975  Sawayama et al. ............. 331/96 X
4,034,313  7/1977  Jones et al. ........................... 331/96

Primary Examiner—Eugene R. LaRoche
Assistant Examiner—Robert J. Pascal
Attorney, Agent, or Firm—Jordan C. Powell

[57]  ABSTRACT

A ring stabilization circuit including a ring and three spaced apart arms, one of which has a dielectric resonator coupled thereto and acts to reflect, to the output arm, a resonant frequency supplied to the input arm. The impedance of the stabilization circuit is tailored to present to an oscillator an impedance value which over temperature, PRF, and other frequency changing perturbations, gives the oscillator the impedance required in order for the frequency drift to be minimized.

22 Claims, 2 Drawing Sheets

PASSIVE STABILIZER FOR A SIGNAL GENERATING SOURCE

BACKGROUND OF THE INVENTION

The present invention pertains to microwave signal generating sources, such as magnetrons, klystrons, traveling-wave-tubes, and solid state sources. Most of these sources, and especially the magnetron, suffer from lack of frequency stability due to temperature and pulse repetition frequency (PRF) changes. In many instances, the instability is so severe, the source is out of specification and must be discarded.

In general, there are three types of prior art stabilization:

1. High Q cavity stabilization, which is difficult to implement due to the size and complexity of microwave cavities, and is, therefore, very expensive. Further, such cavities generally have an inherent insertion loss which is undesirable because of the reduction in power.
2. Injection locking to a stable reference source, which is also complex and expensive because of the size. This method requires power consumption. Further, some sources, such as those mentioned above, are too high in RF output power to be injection phase locked by a stable reference source.
3. Phase locked loops, which is the most costly and technically complex method. This method also requires the most area and greatest number of components.

SUMMARY OF THE INVENTION

It is an object of the present invention to provide new and improved apparatus for passively stabilizing a signal generating source.

It is a further object of the present invention to provide a new and improved method of passively stabilizing signal generating sources.

It is a further object of the present invention to provide apparatus for stabilizing a signal generating source which is smaller, simpler, and cheaper than prior art apparatus for stabilizing signal generating sources.

These and other objects of this invention are realized in a passive stabilizer for use with a signal generating source having loci of constant frequency pulling and a method of constructing the passive stabilizer. The stabilizer includes a ring circuit having an input arm, an output arm, and a third arm, each having one end attached to the ring and spaced apart about the ring such that the distance between the input arm and the third arm is $\lambda/4$ at the desired operating frequency, and similarly the distance between the input arm and the output arm is $\lambda/4$. The distance between the third arm and the output arm is $\lambda/4$. The third arm is coupled to a high-Q dielectric resonator a distance $\lambda/2$ from the ring. Such an arrangement embodies a circuit which presents to the input arm, and thus, the source to be stabilized, a predetermined impedance which closely follows the impedance locus of constant frequency obtained from the constant frequency pulling contours.

BRIEF DESCRIPTION OF THE DRAWINGS

Referring to the drawings.

DESCRIPTION OF THE PREFERRED EMBODIMENT

Many signal generating sources possess poor frequency versus temperature stability. A signal generating source, in this specific example a magnetron, was operated into a range of loads, over a range of pulse repetition frequencies (PRFs), and over a range of temperatures. Three specific temperatures, $-50°$ C., $25°$ C., and $90°$ C., were used to graph three constant frequency contours illustrated in FIG. 1. The constant frequency contours are obtained from pulling curves (not shown) of the magnetron which are generated by operating the magnetron over a wide range of loads and plotting those impedances which produce the same frequency. For example, a given set of impedance values (loads) will effect a constant frequency shift of $F_1$, another set of loads will produce a frequency shift of $F_2$, and so forth. These sets of constant frequency contours generate a set of impedance curves which, when presented to the source to be stabilized, maintains the source at that particular frequency even though the load impedance is varied.

These constant frequency pulling contours are graphed onto a standard Smith chart. Table 1, below, shows frequency offsets taken from a Smith chart containing constant frequency pulling contours as obtained from a production magnetron.

TABLE 1

| $\Delta f$ (MHz) | jx(ohms) | R(ohms) |
|---|---|---|
| −5 | +28 | 50 |
| −4 | +22 | 50 |
| −3 | +15 | 50 |
| −2 | +8 | 50 |
| −1 | +5 | 50 |
| 0 | 0 | 50 |
| +1 | −4 | 50 |
| +2 | −6 | 50 |
| +3 | −12 | 50 |
| +4 | −16 | 50 |
| +5 | −23 | 50 |

Figure 1:
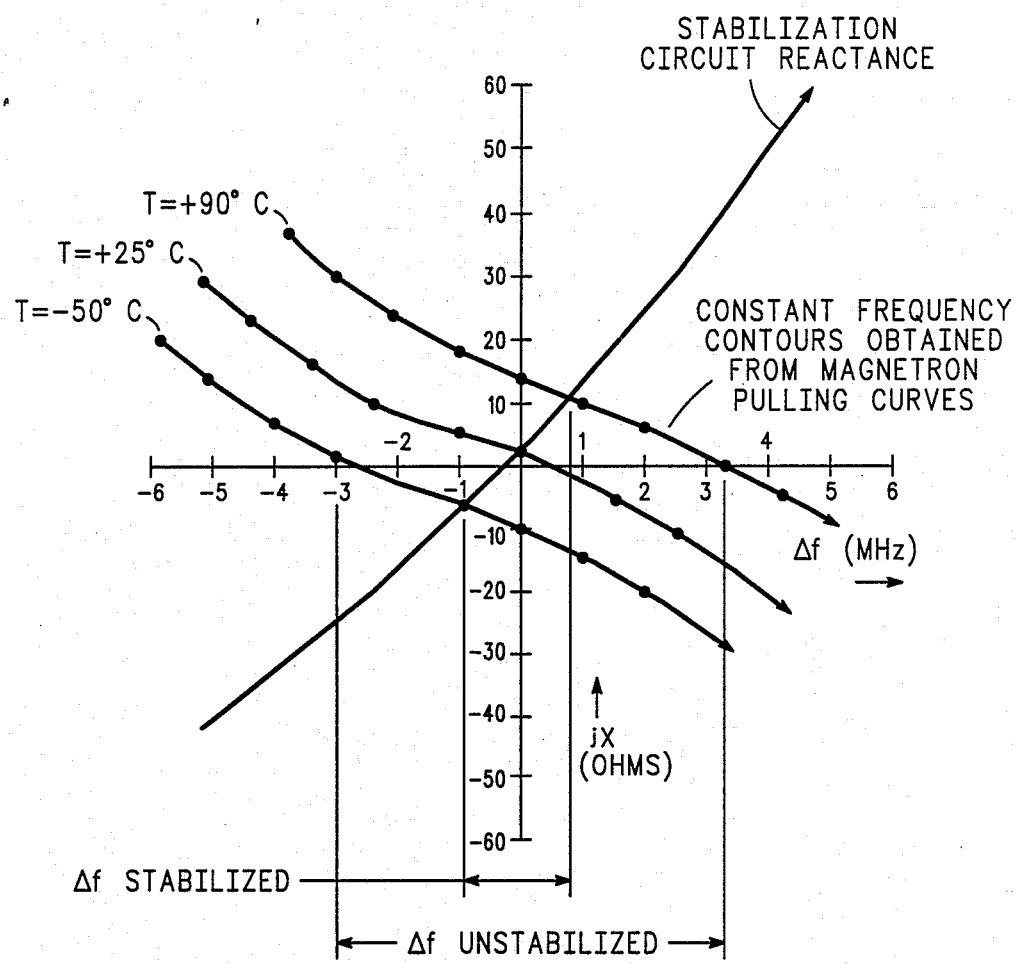
FIG. 1 is a graphical analysis of how passive stabilization of a signal generating source is achieved.

This information is then used to draw the curve labelled $25°$ C. in FIG. 1. Similar curves were charted and drawn for the contour pulling curves at $-50°$ C. and $90°$ C. It will be understood that any other desired temperatures or range of temperatures can be utilized. In general, the Q of the magnetron is relatively constant over temperature so that the pulling curves are generally parallel. It will, of course, be understood that actual charting and graphing may not be necessary to determine the loci of pulling curves for any specific signal generating source, and the charting and graphing is illustrated herein only for the complete explanation of the process. It may be determined empirically, for example, that similar types of sources have generally similar loci of pulling curves. Also, it is completely feasible to simply program a computer to calculate a final set of data. While some of these methods may appear to skip or delete steps of the present process, it should be noted that they are well within the purview of the present invention.

Once the loci of pulling curves have been determined, a locus of impedance is determined which presents to the magnetron an impedance value that gives the magnetron an impedance over temperature PRF, and other frequency perturbating effects required to minimize frequency drift. The locus can be determined in a variety of ways. As a first method loci can be plotted at the outer limits of acceptability and a circuit can then be constructed with a locus of impedance over temperature and PRF which falls within those outer limits. Other potential methods include selecting a desirable circuit (for the specific application) and adjusting the impedance to arrive at an acceptable locus of impedance. It may even be possible in some instances to provide a passive stabilizer of known construction (such as the one to be described presently) and empirically provide any required adjustments, without measurements, etc. Again, such modifications are deemed to be within the scope of this invention since the basic concept is still being utilized.

Figure 2:
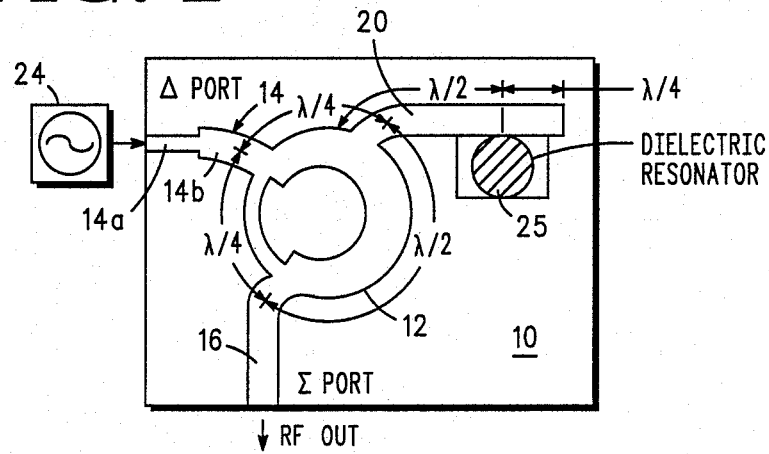
FIG. 2 illustrates a ring stabilization circuit embodying the present invention.

Referring to FIG. 2, a ring stabilization circuit 10 embodying the present invention is illustrated. Circuit 10 includes a ring circuit having a ring 12, an input arm 14, an output arm 16, a third arm 20, and a dielectric resonator 25. Arms 14, 16, and 20 are each connected to ring 12 at one end, with the connected ends spaced apart around the ring. Input arm 14 and output arm 16 are spaced apart a distance of one-quarter wavelength of the operating frequency. Input arm 14 and third arm 20 are spaced apart a distance of one-quarter wavelength of the operating frequency. Third arm 20 and output arm 16 are spaced apart a distance of one-half wavelength of the operating frequency. Hybrid stabilization circuit 10 is formed, in this embodiment, by etching the top circuit plane of a microstrip circuit board (the ground plane being the under side). Because of the availability of small, low loss, and highly stable dielectric materials, stabilization circuit 10 can be constructed very small in size (approximately 0.6 cubic inches).

Input arm 14 is a differential or delta port and output arm 16 is summation port, as will be shown presently. The output of a magnetron 24 (or other source such as those referred to as solid-state sources) is coupled to input arm 14 and a dielectric resonator 25 is mounted adjacent to third arm 20 in electrical coupling therewith. Dielectric resonator 25 is constructed with an operating or resonant frequency at approximately the operating frequency of magnetron 24. Further, dielectric resonator 25 is coupled to third arm 20 approximately one half of a wavelength of the operating frequency from the end attached to ring 12. Third arm 20 continues beyond the coupling point of resonator 25 approximately one-quarter of a wavelength at the operating frequency. At the operating frequency, or resonant frequency of resonator 25, third arm 20 presents a reflection coefficient of +1 to the ring circuit. In some instances it may be possible or desirable to adjust the length of third arm 20 to provide the best VSWR and reflection coefficient. Tracing the path and phase of a signal entering input arm 14, it can be seen that the signal will split in two directions: one wave traveling clockwise to third arm 20 and one wave traveling counter-clockwise toward output arm 16. The clockwise wave will "see" an on resonance reflection coefficient of +1 at third arm 20 and be reflected in two directions. One wave travels back to input arm 14 and arrives −180 out of phase with the input wave (hence signal cancellation and good VSWRs). The wave that continues on from third arm 20 in a clockwise direction arrives at output arm 16 in phase with the counter-clockwise signal and, hence, sums or adds at output arm 16.

Input arm 14 is constructed with two sections, 14a and 14b, each having a different impedance. The two impedances are designed to provide a predetermined total impedance for stabilization circuit 10 when looking into the input port (input arm 14). The section of ring 12 between input arm 14 and output arm 16 has a reduced width (greater inner radius and smaller outer radius) over that in other sections of ring 12 to compensate for differences in impedance between input arm 14 and output arm 16. This design is well-known in the art and will not be discussed at length herein. The reactance portion of the impedance of stabilization circuit 10, as seen by magnetron 24, was tabulated against the frequency change, Δf (MHz), of the pulling curves of magnetron 24 and is given in the Table 2.

TABLE 2

| f (MHz) | jx(Ω) |
|---------|-------|
| −5 | −43.0 |
| −4 | −32.0 |
| −3 | −26.0 |
| −2 | −17.0 |
| −1 | −8.0 |
| 0 | 0 |
| +1 | +11.5 |
| +2 | +22.0 |
| +3 | +32.0 |
| +4 | +43.0 |
| +5 | +55.0 |

The data from Table 2 is plotted in FIG. 1 as the stabilization circuit reactance. The combination of magnetron 24 and stabilization circuit 10 form a combined circuit which will operate where the constant pulling curves for magnetron 24 and the stabilization circuit reactance of stabilization circuit 10 intersect.

As can be seen from FIG. 1, magnetron 24 drifted approximately −3 MHz at −50° C. and approximately −3.3 MHz at +90° C., a total of 6.3 MHz over the temperature range, when it was unstabilized. Stabilizing magnetron 24 with stabilizing circuit 10 reduced the frequency drift to approximately −1 MHz at −50° C. and +0.8 MHz at +90° C., or a total of 1.8 MHz. It should be noted that the Q of stabilization circuit 10 is approximately 350. Thus, high Q stabilization circuits are not necessary for adequate stabilization. However, it can be seen that the higher the Q the lower the frequency drift.

Figure 3:
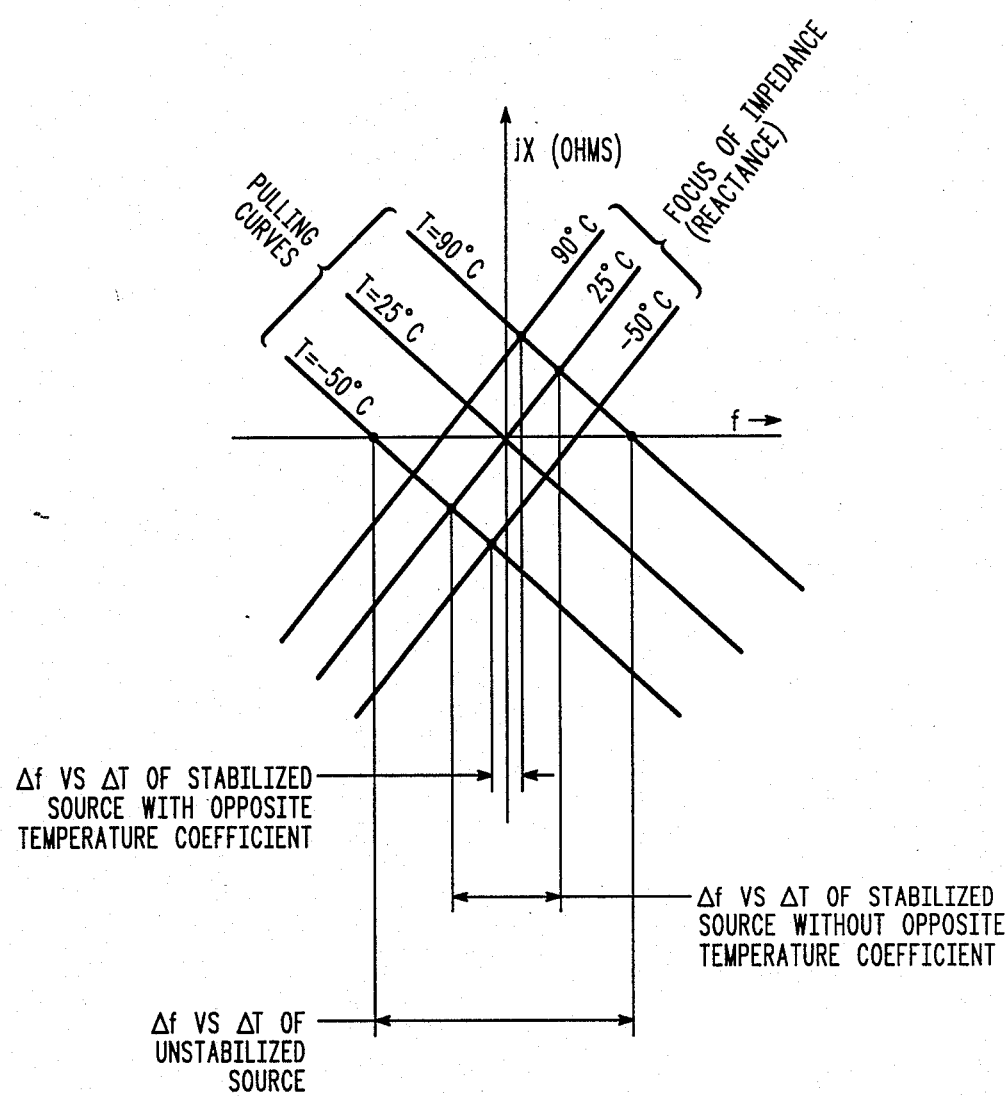
FIG. 3 is a graphical analysis similar to that of FIG. 1, including temperature compensation.

Stabilization circuit 10 is designed with temperature stabilization by mounting dielectric resonator 25 in a housing which has a temperature coefficient that substantially offsets the temperature coefficient of dielectric resonator 25. For example, in this embodiment dielectric resonator 25 has a temperature coefficient of +4 ppm/degree centigrade and housing has a temperature coefficient of −4 ppm/degree centigrade. Thus, the locus of impedance (reactance) over the temperature range of −50° C. to +90° C. is a single line as illustrated in FIG. 1. If further improvements in the degree of stabilization are desired, the stabilization circuit should be designed to have the opposite temperature coefficient of the signal generating source to be stabilized. For example, FIG. 3 illustrates the pulling curves for a source, similar to FIG. 1, for the temperatures −50° C., 25° C., and 90° C. Three locus of impedance curves (reactance) are illustrated for the same temperatures. It should be noted, however, that the curves are reversed in order because of the opposite temperature coefficient. The unstabilized frequency drift is illustrated as before. The stabilized frequency drift without the opposite temperature coefficient is illustrated as the center, or 25° C., curve. It can be seen that this again is substantially as illustrated in FIG. 1. The stabilized frequency drift with opposite temperature coefficient, temperature stabilization, is illustrated by the three locus of impedance curves (reactance) designated 90° C., 25° C., and −50° C. The operating points of the stabilized circuit are at the intersections of the 90° C. pulling curve and the 90° C. locus of impedance curve, the 25° C. pulling curve and the 25° C. locus of impedance curve, and the −50° C. pulling curve and the −50° C. locus of impedance curve. It can be seen from FIG. 3 that the total frequency drift over the range of 90° C. to −50° C. has been reduced to approximately 0.7 MHz.

Thus, a new and improved passive stabilization circuit is disclosed which is small, low loss (approximately 1 db) and inexpensive. Also, the circuit may be constructed with low Q, although high Q is achievable. While a specific stabilizing circuit has been described in conjunction with a magnetron, it will be understood by those skilled in the art that other signal generating sources, such as klystrons, traveling wave tubes, and solid-state devices might also be stabilized (it has been proven in the laboratory that pulsed IMPATT diode oscillators are capable of being stabilized) and that other types and constructions of stabilizing circuits might be utilized. Because the stabilizing circuit is passive the reliability of the total circuit is improved and the cost and power consumption are reduced. Also, signal generating sources that would otherwise be out of specification and useless can now be easily brought within specification and saved.

While I have shown and described specific embodiments of the present invention, other improvements and modifications may occur to those skilled in the art. I desire it to be understood, therefore, that this invention is not limited to the particular forms shown and I intend in the appended claims to cover all modifications which do not depart from the spirit and scope of this invention.

What we claim is:

1. A passive stabilizer for use with a signal generating source comprising:
    a ring circuit means for stabilizing the signal generating source having an operating frequency and including a ring with an input arm, an output arm, and a third arm, each having one end attached to the ring, the attached ends of the input and output arms being spaced apart approximately one-quarter wavelength of the operating frequency, the attached ends of the input and third arms being spaced apart approximately one-quarter wavelength of the operating frequency, and the attached ends of the output and third arms being spaced apart approximately one-half wavelength of the operating frequency;
    a resonator means for determining said operating frequency, said resonator means coupled to the third arm of said ring circuit means and having a resonant frequency at approximately the operating frequency; and
    said ring circuit means being constructed to present at the input arm a predetermined impedance locus.

2. A passive stabilizer for use with a signal generating source as claimed in claim 1 wherein the resonator means is coupled to the third arm approximately one-half wavelength of the resonant frequency from the end attached to the ring.

3. A passive stabilizer for use with a signal generating source as claimed in claim 2 wherein the third arm extends beyond the one-half wavelength coupling point approximately one-quarter wavelength of the resonant frequency.

4. A passive stabilizer for use with a signal generating source as claimed in claim 1 wherein the ring circuit means is constructed in a microstrip circuit board.

5. A passive stabilizer for use with a signal generating source as claimed in claim 1 wherein the prdetermined impedance locus is provided at least partially by constructing the input arm with a plurality of different segments.

6. A passive stabilizer for use with a signal generating source as claimed in claim 5 wherein the input arm is constructed with an input segment having a first impedance and a second segment coupling the input segment to the ring and having a second impedance, the first and second impedances combining to provide the predetermined impedance locus.

7. A passive stabilizer for use with a signal generating source as claimed in claim 1 including in addition temperature stabilizing means forming a part of the ring circuit means.

8. A passive stabilizer for use with a signal generating source as claimed in claim 7 wherein the resonator means has a predetermined temperature coefficient and the temperture stabilizing means includes a housing at least partially surrounding the resonator means and having a temperature coefficient substantially offsetting the temperature coefficient of the resonator means.

9. A passive stabilizer for use with a signal generating source as claimed in claim 8 wherein the temperature coefficient of the resonator means is approximately +4 ppm/degree centigrade and the temperature coefficient of the housing is approximately −4 ppm/degree centigrade.

10. A method of stabilizing a microwave signal generating source with a passive stabilizer comprising the steps of:
    measuring the output of the signal generating source with a plurality of different loads, pulse repetition frequencies (PRFs), and temperatures;
    determining a plurality of loci of constant frequency pulling curves from the measured outputs and, from the plurality of loci of constant frequency pulling curves, determining a locus of impedance over temperature and PRF at the output of the signal generating source which gives the signal generating source an impedance required to minimize frequency drift;
    constructing a passive stabilizer including a ring circuit having a ring and an input arm, an output arm, and a third arm each connected to the ring at one end, a resonator with a resonant frequency coupled to the third arm, and the three arms being spaced apart and constructed to present at the input arm an impedance locus approximating the determined locus of impedance; and
    connecting the output of the microwave signal generating source to the input arm of the passive stabilizer.

11. A method of stabilizing a microwave signal generating source with a passive stabilizer as claimed in claim 10 wherein the ring circuit has an operating frequency approximately the same as the resonant frequency of the resonator and the step of constructing the ring circuit further includes spacing apart the input and output arms one-quarter wavelength at the operating frequency, spacing apart the input and third arms one-quarter wavelength at the operating frequency, and spacing apart the output and third arms one-half wavelength at the operating frequency.

12. A method of stabilizing a microwave signal generating source with a passive stabilizer as claimed in claim 11 wherein the step of constructing the ring circuit further includes coupling the resonator to the third arm of the ring hybrid circuit approximately one-half wavelength of the resonant frequency from the end of the third arm which is attached to the ring.

13. A method of stabilizing a microwave signal generating source with a passive stabilizer as claimed in claim 12 wherein the step of constructing the ring circuit further includes adjusting the overall length of the third arm to optimize the voltage standing wave ratio (VSWR) of the passive stabilizer.

14. A method of stabilizing a microwave signal generating source with a passive stabilizer as claimed in claim 10 including in addition the steps of determining the temperature coefficient of the resonator and temperature stabilizing the passive stabilizer by placing the resonator in a housing having a temperature coefficient approximately opposite the temperature coefficient of the resonator.

15. A method of stabilizing a microwave signal generating source with a passive stabilizer comprising the steps of:
measuring the output of the signal generating source with a plurality of different loads, pulse repetition frequencies (PRFs), and temperatures;
determining a plurality of loci of constant frequency pulling curves from the measured outputs and, from the plurality of loci of constant frequency pulling curves, determinig a locus of impedance over temperature and PRF at the output of the signal generating source which gives the signal generating source an impedance required to minimize frequency drift;
constructing a passive stabilizer including a hybrid circuit with a resonant frequency and having a body, an input, and an output, resonant frequency from the input to the output of the body, and the passive stabilizer being constructed to present at the input an impedance locus approximating the determined locus of impedance;
connecting the output of the microwave signal generating source to the input of the passive stabilizer.

16. A high power microwave oscillator with passive stabilizer comprising:
a high-power microwave oscillator having an output;
a ring circuit means for stabilizing said high power microwave oscillator, said ring circuit means having an operating frequency and including an input arm, an output arm, and a third arm, the input and output arms being spaced apart approximately one-quarter wavelength of the operating frequency, the input and third arms being spaced apart approximately one-quarter wavelength of the operating frequency, and the output and third arms being spaced apart approximately one-half wavelength of the operating frequency;
a resonator means for determining said operating frequency, said dielectric resonator means coupled to the third arm of said ring circuit means;
said ring circuit means being constructed to present at the input arm a predetermined impedance locus; and
the output of said oscillator being coupled to the input arm of said ring circuit means.

17. A high power microwave oscillator with passive stabilizer as claimed in claim 16 wherein the oscillator is chosen from a group comprising a magnetron, a klystron, a traveling-wave-tube, and high power solid-state sources.

18. A method of stabilizing a microwave signal generating source with a passive stabilizer comprising the steps of:
measuring the output of the signal generating source with a plurality of different loads, pulse repetition frequencies (PRFs), and temperatures;
determining a plurality of loci of constant frequency pulling curves from the measured outputs and, from the plurality of loci of constant frequency pulling curves, determining a locus of impedance over temperature and PRF at the output of the signal generating source which gives the signal generating source an impedance required to minimize frequency drift;
providing a microstrip circuit board;
forming a ring circuit in an upper surface of the microstrip circuit board including a ring, and an input arm, an output arm, and a third arm each having an end connected to the ring and spaced apart about the ring, the ring circuit being further formed to present at the input arm an impedance locus approximating the determined locus of impedance;
providing a resonator in the microstrip circuit board coupled to the third arm approximately one-half wavelength of the resonant frequency from the end connected to the ring; and
connecting the output of the microwave signal generating source to the input arm of the passive stabilizer.

19. A method of stabilizing a microwave signal generating source with a passive stabilizer as claimed in claim 18 including the step of temperature stabilizing the resonator.

20. A method of stabilizing a microwave signal generating source with a passive stabilizer as claimed in claim 19 including the step of adjusting the overall length of the third arm to optimize the voltage standing wave ratio (VSWR) of the passive stabilizer.

21. A passive stabilizer for use with a signal generating source according to claim 1 wherein said resonator means comprises a dielectric resonator.

22. A high power microwave oscillator with passive stabilizer according to claim 16 wherein said resonator means comprises a dielectric resonator.

* * * * *

UNITED STATES PATENT AND TRADEMARK OFFICE
CERTIFICATE OF CORRECTION

PATENT NO. : 4,843,347

DATED : June 27, 1989

INVENTOR(S) : Bernard E. Sigmon and Lawrence J. Schumacher

It is certified that error appears in the above-identified patent and that said Letters Patent is hereby corrected as shown below:

On the title page

The second inventor's last name is misspelled. It should be --Schumacher--.

Signed and Sealed this

Third Day of July, 1990

Attest:

HARRY F. MANBECK, JR.

*Attesting Officer*      *Commissioner of Patents and Trademarks*